(12) United States Patent
Tan

(10) Patent No.: US 7,589,570 B1
(45) Date of Patent: Sep. 15, 2009

(54) SYSTEM AND METHOD FOR SYNCHRONIZED CURRENT BOOSTING

(75) Inventor: Kee Hian Tan, Singapore (SG)

(73) Assignee: Marvell International Ltd., Hamilton (BM)

( * ) Notice: Subject to any disclaimer, the term of this patent is extended or adjusted under 35 U.S.C. 154(b) by 13 days.

(21) Appl. No.: 11/876,443

(22) Filed: Oct. 22, 2007

Related U.S. Application Data

(60) Provisional application No. 60/864,290, filed on Nov. 3, 2006.

(51) Int. Cl.
*H03B 1/00* (2006.01)
*H03K 3/00* (2006.01)

(52) U.S. Cl. ............... 327/108; 327/109; 327/110; 327/111; 327/112; 326/82; 326/83

(58) Field of Classification Search ......... 327/108–112; 326/82–83; 360/46
See application file for complete search history.

(56) References Cited

U.S. PATENT DOCUMENTS 6,552,584 B2 * 4/2003 Galli .................... 327/112
6,720,803 B2 * 4/2004 Pihlstrom ................ 327/108

* cited by examiner

*Primary Examiner*—Lincoln Donovan
*Assistant Examiner*—John W Poos

(57) ABSTRACT

A circuit system and method are provided to modify a hard disk writer/driver pre-amplifier electronic circuit to synchronize current boosting control signals. The circuit system obtains a single boosting control signal from a single source. Component boosting control signals, a positive and negative boosting control signal are indirectly generated via processing through two independent intermediate circuits. The two boosting control signals are pulse shaped signals via intermediate circuits which generate the corresponding first and second intermediate output signals in a manner that the two intermediate output signals are made compatible with one another and particularly synchronize to be later combined by some manner of combiner circuit without the generation of unwanted components in the output signal. The circuit design includes changing a CMOS technology based writer/driver circuit to a BiCMOS technology based circuit in which an NMOS transistor receiving a negative boosting control is replaced by an equivalent bipolar NPN transistor and an appropriate biasing circuit.

49 Claims, 5 Drawing Sheets

SYSTEM AND METHOD FOR SYNCHRONIZED CURRENT BOOSTING

INCORPORATION BY REFERENCE

This application claims the benefit of U.S. Provisional Application Ser. No. 60/864,290, "SYNCHRONIZED CURRENT BOOSTING," filed on Nov. 3, 2006, including all cited references which are incorporated herein by reference in their entirety.

BACKGROUND

A hard disk writer/driver system requires a specialized electronic circuit to produce a signal in order to drive a writing inductor. The writer/driver electronic circuit launches short duration high voltage signals or a pulsed signal across the writing inductor. Based on a need to produce these high voltage signals, a writer/driver pre-amplifier is often included as a sub-system of a writer/driver electronic circuit. The response time of writer/driver pre-amplifier must be extremely fast for a high speed writing system. Complementary Metal Oxide Semiconductor (CMOS) technology based writer/driver pre-amplifier electronic circuits are conventionally used for such applications based on their response time as compared to NPN or bipolar transistor technology based circuits.

In specific applications, a pair of control signals are used. The first for a P-type Metal Oxide Semiconductor (PMOS) section of the circuit is generally referred to as positive boosting control signal. The second for an N-type Metal Oxide Semiconductor (NMOS) section of the circuit is generally referred to as a negative boosting control signal. Both the positive boosting control signal and the negative boosting control signal are most often represented as pulsed signals, retaining a specific voltage level $V_1$ for a certain duration of time $T_1$ and then switching to another voltage level $V_2$ for another duration of time $T_2$. The signals transition between two different voltage levels are often different for the positive boosting control signal and for the negative boosting control signal. For high speed writing systems, the two time durations $T_1$ and $T_2$ are very small.

The requirements for the presently employed boosting control signals include that they are asymmetric relative to one another. In order to generate the relatively asymmetrical positive and negative boosting control signals, an input signal is conventionally processed through separate electronic circuit components in a manner that the single input signal may be split into separate signals to generate the above-discussed asymmetry. A consequence of processing the input signal through separate electronic circuits to generate separate boosting control signals is that the two boosting control signals are subjected to differing time delays in processing. As a result, two boosting control signals are rendered asynchronous in a time domain.

The difference in the time delays that the two boosting control signals are subjected to during processing could be significant at high writing speeds. The asymmetric nature of the positive and negative boosting control signals, therefore, results in asynchronous signaling of the non-identical signal levels. A result of the presenting asynchronous asymmetric positive and negative boosting control signals to the writer/driver pre-amplifier electronic circuit may be the undesired effect of unequal common mode (CM) voltage at two output nodes, across which a differential output signal of the writer/driver pre-amplifier electronic circuit may be generated by combining the two boosting signals. As such, there may be CM voltage spikes in the output of a CMOS writer/driver pre-amplifier electronic circuit. These unwanted spikes are fed to the writing inductor resulting in unsatisfactory performance of the hard disk writer, and possible damage.

To better illustrate the situation described above, FIG. 1 schematically illustrates a high level simplified block diagram of an exemplary hard disk writing system 1000. As shown in FIG. 1, the system 1000 may include an input data source 1010 that may provide a data signal 1015 representing data to be written on a hard disk, and a number of intermediate components for processing the input data before the system generates a drive signal across the writing inductor 1110. These intermediate components may include, for example, a writing pulse signal generator 1020, the output 1025 of which may be input, in parallel, to a positive boosting control signal generator 1030 and a negative boosting control signal generator 1040. The outputs 1035, 1045 respectively of the positive boosting control signal generator 1030 and the negative boosting signal generator 1040 may be input to separate pulse signal shaping systems 1050, 1060, the outputs 1055, 1065 of which may subsequently be input to level adjusters 1070, 1080. The outputs 1075, 1085 of the level adjusters 1070, 1080, respectively, may be input to a writer/driver pre-amplifier 1090. The differential input pair 1093, 1097 of the writer/driver pre-amplifier 1090 may be input to an amplifier 1100, the output 1105 of which is input to a writing inductor 1110.

The data signal 1015 provided by the input data source 1010 may include logic levels and may already have been processed to make the data signal 1015 as true a copy of the data that was intended to be written on the hard disk that is possible. The data signal 1015 may be input to a writing pulse signal generator 1020 that may convert the logic levels in the data signal 1015 into a writing pulse signal 1025 at suitable voltage levels. The writing pulse signal 1025 may have several discriminating characteristics associated with it. These may include pulse signal transition time instants, a pulse signal transition high level, a pulse signal transition low level, a pulse signal rise time, a pulse signal fall time, a pulse signal duration, or a pulse signal duty cycle. Based on the specifications of the writing inductor 1110, one or more of the discriminating characteristics may be suitably set. For example, as the speed of writing increases the writing pulse signal duration may be reduced and accordingly the writing pulse signal rise time and the writing pulse signal fall time durations may also be reduced.

The writing pulse signal 1025 may be processed along two distinct processing paths. In order to perform very high speed writing and driving, the writing pulse signal 1025 ultimately crosses the writing inductor 1110 in a balanced manner. Two separate pulse signals may be generated, one each through separate distinct processing paths. The two different pulse signals include a positive boosting control signal 1035, via a positive boosting control signal generator 1030, and a negative boosting control signal 1045, via a negative boosting control signal generator 1040. The positive boosting control signal 1035 and the negative boosting control signal 1045 may be related to each other in the sense that as the positive boosting control signal 1035 may transition from a higher level to a lower level, the negative boosting control signal 1045 may transition from a lower level to a higher level and vice versa. The signals are, therefore processed to be generally asymmetric for reasons mentioned above and as will be discussed in greater detail below.

The processing paths may include related positive and negative boosting control signal generators 1030, 1040, that may generate pulse signal with suitable asymmetric transitions from one voltage level to another, pulse signal shaping system 1050, 1060 that may clean up the input signals 1035, 1045 to produce an output signals 1055, 1065 such that the output signals 1055, 1065 may have rise and fall times that are acceptable according to a pre-specified criterion. The output signals 1055, 1065 of the pulse signal shaping systems 1050, 1060 may be input to level adjusters 1070, 1080 such that output signals 1075, 1085 of the level adjusters 1070, 1080 may have suitable values of pulse signal transition high and pulse signal transition low levels. A need for level adjustment may arise because the subsequent processing block, writer/driver pre-amplifier 1090, may require input signals with a pre-specified value of transition levels.

The pair of inputs, positive boosting control signal 1075 and negative boosting control signal 1085 may be input to writer/driver pre-amplifier 1090 that may produce a pair of outputs 1093 and 1097. The writer/driver pre-amplifier 1090 may generate enough signal strength at the outputs 1093 and 1097 such that the outputs 1093 and 1097 may be effectively amplified through the amplifier block 1100, so that a short duration high voltage write pulse signal may be provided to the writing inductor 1110, in order that the writing process may be accomplished successfully.

FIG. 2 illustrates a simple schematic of a CMOS technology based hard disk writer/driver pre-amplifier electronic circuit 2000. A PMOS transistor PM2100 and an NMOS transistor NM2200 have inputs I2100 and I2110, respectively. In one cycle of operation, both the inputs I2100 and I2110 are the boosting control signals 2300 and 2350, respectively, having pulse signal characteristics and being applied substantially simultaneously. The signal at input I2100 makes a transition from the voltage level $V_{DD}$ to $V_{SS}$, wherein $V_{DD} > V_{SS}$, and then makes transition back from the voltage level $V_{SS}$ to $V_{DD}$. The duration of the pulse signal at input I2100 is the length of time for which the input I2100 remains at the level $V_{SS}$, which is equal to $T_P$. The input I2110 makes a transition from the voltage level $V_{EE}$ to $V_{SS}$, wherein $V_{EE} < V_{SS}$, and then makes transition back from the voltage level $V_{SS}$ to $V_{EE}$. The duration of the pulse signal at input I2110 is the length of time for which the input I2100 remains at the level $V_{SS}$, which has a value substantially close to $T_P$. Both the transitions, $V_{DD}$ to $V_{SS}$ in I2100 and $V_{EE}$ to $V_{SS}$ in I2110 are intended to occur in a synchronous manner substantially simultaneously. Similarly, both the transitions, $V_{SS}$ to $V_{DD}$ in I2100 and $V_{SS}$ to $V_{EE}$ in I2110 are intended to occur in a synchronous manner substantially simultaneously. In the same mode of operation, the inputs I2210 and I2200 to the PMOS transistor PM2200 and NMOS transistor NM2100 have DC values 2400 and 2450, respectively.

Subsequently, in a next cycle, the roles would be reversed with the input I2210 of PMOS transistor PM2200 and input I2200 of NMOS transistor NM2100 having the pulse signal characteristics and being applied substantially simultaneously identical to the inputs I2100 and I2110 in the depicted cycle. Similarly, the inputs I2100 and I2110 to the PMOS transistor PM2100 and NMOS transistor NM2200 have DC values identical to the inputs I2200 and I2210 in the depicted cycle.

During the depicted cycle of operation, the input I2100, which in a simplified form is the gate terminal of PM2100, is a boosting control signal 2300 of a duration Tp that sends the output node U2100 high and hence is described as a positive boosting control signal. Substantially simultaneously, during the same depicted cycle of operation, the input I2110, which in a simplified form is gate terminal of NM2200, is a boosting control signal 2350 of a duration very close to Tp that sends the output node U2200 low and hence is described as a negative boosting control signal. The net result of this operation is an enhanced differential output between nodes U2100 and U2200. Similarly, during a next cycle of operation, the net result would be an enhanced differential output between nodes U2200 and U2100.

The two boosting control signals 2300 and 2350 are pulse signals that ideally should transition exactly identically in time. However, in practice, they may occur substantially simultaneously. In addition, the two control inputs 2400 and 2450 are boosting control signals that ideally should transition exactly identically in time. However, in practice they may also occur substantially simultaneously.

The electronic circuit of FIG. 2 suffers from drawbacks that the two boosting control signals 2300 and 2350 having opposing transitions as well as having higher and lower transition levels that are generally different. The opposing transitions are such that as one makes a transition from a lower level to a higher level, the other makes a transition from a higher level to a lower level and vice versa. Conventionally, this means that the boosting control signals 2300 and 2350 must be generated through different electronic circuits with the attendant drawbacks, as discussed above. Consequently, the two input signals I2100 and I2110 experience different delays based on individual circuit elements being different.

It should be noted that individual device characteristics, such as, for example parasitic capacitance, may play a significant role in determining a signal delay through an individual device. Individual device delays may vary with the distinct, operating voltage levels. The delays are generally cumulative and not easily predicted or modeled, thus resulting in unwanted output characteristics when the signals are combined, one example being the CM voltage spikes discussed above. Often, processing delays through the devices are non-linear, are functions of the operating voltage levels. Consequently, the two boosting control signals, although ideally needing to be substantially synchronous in time domain are rendered, to some extent, asynchronous.

In high speed writing, where the hard disk writer electronic circuit must respond in sub-nanosecond time intervals, different delays of even several tens of picoseconds between a positive boosting control signal 2300 and a negative boosting control signal 2350 may be adverse to the operation of the system. The hard disk writing process, for example, involves launching a short time duration high voltage pulse signal across a writing inductor, which needs high current through the writing inductor for satisfactory operation. To generate the needed high current through an amplifier 1100, as shown in FIG. 1, requires switching equivalently high currents through the PM2100 and NM2100 pair as well as PM2200 and NM2100 pair. A challenging task is to accomplish this magnitude of current switch cleanly in less than a few tens of picoseconds.

CM voltage spikes degrade the writing process and the amount of degradation is more pronounced with higher writing speeds. The resulting degradation may impact error free data storage. In order to retain the retrieved data integrity at a satisfactory level, advanced signal processing and/or coding techniques may be required, resulting in an increase in the cost, size and the power consumption of the electronic circuit that performs writing and/or retrieving information in the hard disk system.

SUMMARY

In view of the above shortfalls, it would be advantageous to provide a writer/driver electronic circuit used to store/retrieve data on a hard disk that generates short duration high voltage pulse signals in order to activate the writing inductor in a synchronous manner in order to avoid unacceptable output signal components, such as, for example, CM voltage spikes.

In order to address the above concerns, the systems and methods according to this disclosure may implement a BiCMOS electronic circuit that does not require separate generation of asymmetric positive and negative boosting of a control signal for satisfactory operation.

In various exemplary embodiments, the systems and methods according to this disclosure may provide, via a BiCMOS circuit, an ability to synchronize a current boosting signal to reduce or otherwise substantially eliminate unwanted, undesirable, or unacceptable components in constituent signals, or an output signal from a signal amplifier. In this regard, the problem of, for example, CM voltage spikes appearing at the output of a pre-amplifier electronic circuit may be substantially mitigated or eliminated.

In various exemplary embodiments, the systems and methods may implement an electronic circuit that performs pre-amplification of positive and negative boosting control signals in such a manner that one or the other of the boosting control signals can be lapsed in time in an effort to make the signals substantially synchronous with each other under most operating conditions.

It should be appreciated that a design of an electronic circuit according to this disclosure may be such that separate boosting control signals need not be subject to overly strict matching of like characteristics at generation that may produce significant distortions in the differential output of the pre-amplifier electronic circuit. Rather, as a significant improvement over conventional systems, the proposed systems and methods may be able to accept symmetric and synchronous pulse signals as the positive and negative boosting control signal inputs. In such a scenario, both the positive and negative boosting control signal may be generated from substantially identical electronic signal configurations and hence would have substantially identical delays when generated.

An ability to generate substantially synchronous signals and to adjust those signals to improve the synchronization of the signals may advantageously mitigate the distortions in the unwanted, undesired, or unacceptable signal component in the differential output of the pre-amplifier electronic circuit.

In various exemplary embodiments the systems and methods according to this disclosure may modify the CMOS technology based pre-amplifier electronic circuit by including a Bipolar technology based electronic circuit that can be suitable biased utilizing a biasing circuit such that a boosting input control signal from a single source may generate both a positive boosting control signal and a negative boosting control signal that are substantially synchronous.

In various exemplary embodiments, the systems and methods according to this disclosure may provide a way to implement pre-amplifier electronic circuit using BiCMOS technology so that the pre-amplifier output may be substantially free of undesirable components, such as, for example, CM voltage spikes.

In various exemplary embodiments, the systems and methods according to this disclosure may provide two intermediate circuits in which a boosting input control signal from a single source may be input to both of the intermediate circuits in parallel. It should be appreciated that the first intermediate circuit may include a CMOS transistor and the second intermediate circuit may include a bipolar transistor. Further, the second intermediate circuit, including the bipolar transistor, may further include a biasing circuit. The first intermediate circuit may include a logic inverter depending on whether the CMOS transistor is a PMOS type or an NMOS type.

In various exemplary embodiments, the systems and methods according to this disclosure may modify a specific discriminating characteristic of one or both of the boosting input control signals that is processed through the first intermediate circuit or the second intermediate circuit such that any other specific discriminating characteristic of the first intermediate output and the second intermediate output may be made compatible. It should be appreciated that the compatibility between the two intermediate outputs with regard to a predetermined discriminating characteristic may be based on a pre-specified criterion.

In various exemplary embodiments, the systems and methods according to this disclosure, may measure compatibility of a predetermined characteristic between the two intermediate outputs by computing a magnitude of a difference between the values of the predetermined characteristic corresponding to each of the two intermediate outputs. Alternatively, a test for compatibility of a predetermined characteristic between the two intermediate outputs may involve computing a statistical quantity which is a mean and/or a standard deviation of a difference between the values of the predetermined characteristic corresponding to each of the two intermediate outputs.

In various exemplary embodiments, the systems and methods according to this disclosure may have a biasing circuit that may include but not be limited to a combination of one or more of a resistive network, bipolar transistor network, a network of DC current sources or a capacitive network. The resistive network may include a tunable resistive element. The network of DC current sources may include a tunable current source element. A DC bias of the bipolar transistor that is part of the second intermediate circuit may be set by a combination of one or more of the resistive network, the bipolar transistor network and the network of DC current sources.

These and other features of disclosed systems and methods will be apparent from the following detailed description of exemplary embodiments.

BRIEF DESCRIPTION OF THE DRAWINGS

Exemplary embodiments of disclosed systems and methods for a synchronized current boosting system will be described, in detail, with reference to the following drawings, wherein.

DETAILED DESCRIPTION

The following description of embodiments illustrates examples of systems and methods to be used in an electronic circuit pre-amplifier to provide synchronized current boosting control signals. The exemplary embodiments according to this disclosure may refer to a specific application of a hard disk writer/driver pre-amplifier, as discussed in detail above, for the sake of clarity and ease of depiction and description, and as one example of an operating environment to which the disclosed systems and methods may be suited. The exemplary embodiments, as depicted in the accompanying figures, and as described in detail below, should not, however, be considered to be limited to an such application. Virtually any application in which a combined output signal based on an input signal may benefit from synchronized boosting based on a biasing circuit biasing one or more characteristics of an input signal to make such input signal compatible as between a CMOS transistor output and a bipolar transistor output is contemplated. The exemplary descriptions below, and the depictions in the accompanying figures are, therefore, intended to be simply illustrative, and in no way limiting to the disclosed subject matter. Systems and methods according to this disclosure may find application in signal circuit design as it pertains to myriad applications as may be recognized by one of ordinary skill in the art.

The systems and methods according to this disclosure are directed, among other objectives, at remedying a circumstance in which two pulse type boosting control signals, positive and negative are introduced to a pre-amplifier circuit, having been processed through different source circuits, rendered the asymmetric signals asynchronous. In exemplary embodiments, the disclosed systems and methods seek to provide the two booster control signals from an identical source appropriately conditioned and biased to be asymmetric yet substantially synchronous. A result is that all the conditions requisite of a substantially synchronous boosting are met, namely that voltage levels across which a switching transition takes place are substantially identical, the polarity of transitions are identical, and the transitions take place at substantially identical instances in a time domain.

Figure 3:
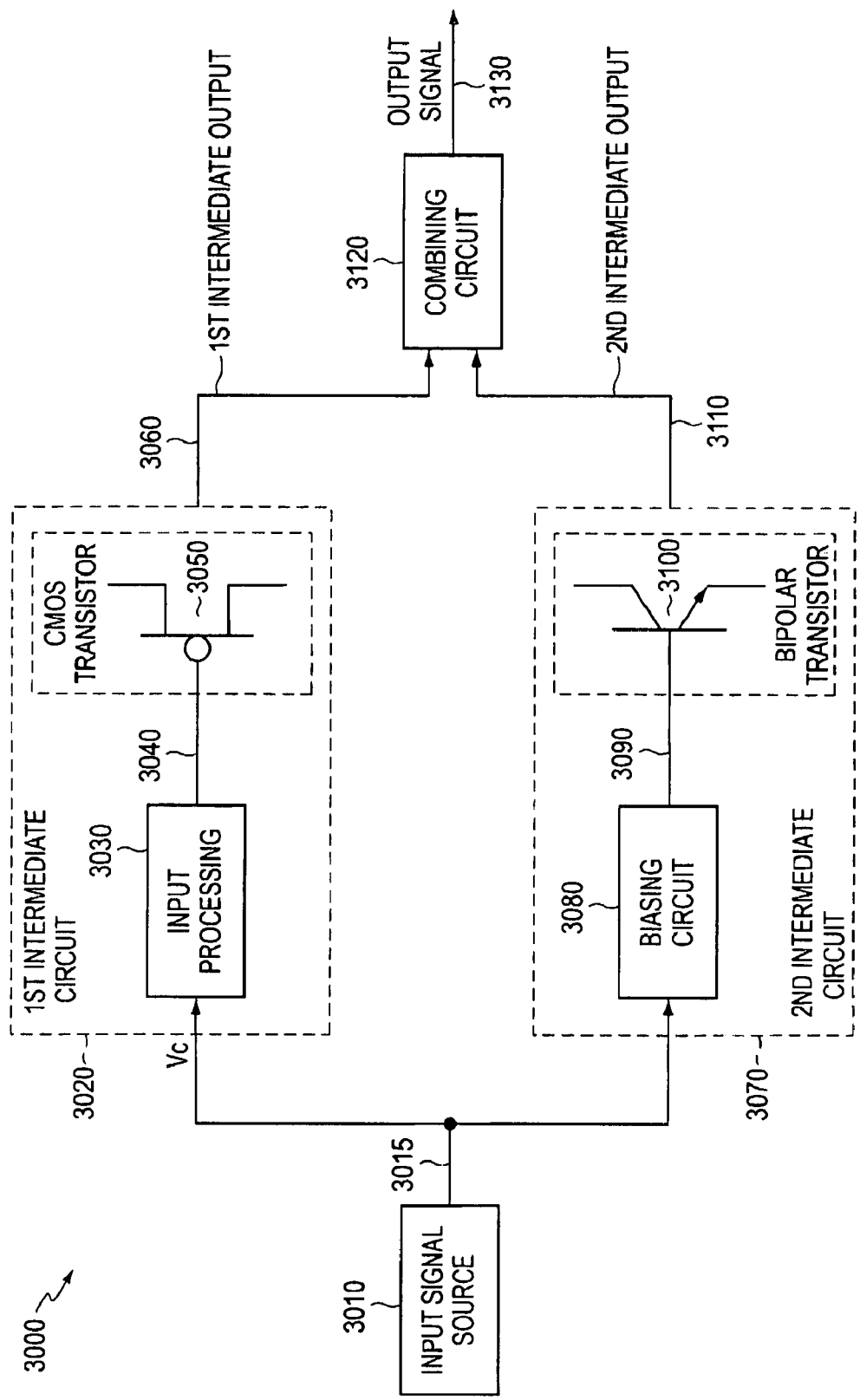
FIG. 3 schematically illustrates an exemplary embodiment of a synchronized current boosting circuit according to this disclosure.

FIG. 3 schematically illustrates an exemplary embodiment of the circuit 3000 for implementing synchronized current boosting according to this disclosure. As shown in FIG. 3, an input signal source 3010 may provide an input signal 3015. The input signal source 3010 may be a part of the circuit 3000, or may separately provide an input signal to the circuit 3000. The input signal source 3010 may present the input signal 3015 in any manner which is compatible with the circuit 3000 and each of the devices, units and/or intermediate circuits comprising the circuit 3000.

Circuit 3000 may further include a plurality of intermediate circuits 3020, 3070, depicted in FIG. 3 as a first intermediate circuit 3020 and a second intermediate circuit 3070. Certain specific components of the first intermediate circuit 3020 and the second intermediate circuit 3070 are different and suited to operating in conjunction with one another in parallel to provide output intermediate signals 3060, 3110 that are substantially synchronized according to the following disclosure.

The input signal 3015 generated by the input signal source 3010 may be presented to each of the intermediate circuits 3020, 3070 directly. The intermediate circuits 3020, 3070 are intended to be disposed, and to operate, are in parallel with one another. Each of the intermediate circuits 3020, 3070, respectively, may produce an intermediate output signal 3060, 3110, which may ultimately be combined via some manner of combining circuit 3120 to produce an ultimate output signal 3130.

Among the objectives of a synchronized current boosting circuit, such as that shown in exemplary manner in FIG. 3, is to substantially reduce, or to otherwise eliminate, unacceptable components in the produced output signal 3130. Such unacceptable components are discussed in detail above and include any manner of transients that may appear synchronously or asynchronously in the output signal 3130.

A first intermediate circuit 3020 may include at least one CMOS transistor 3050. CMOS transistor 3050 is not intended to be limited to any specific type. In other words, a PMOS type and/or an NMOS type transistor may be provided in the first intermediate circuit 3020. Additionally, first intermediate circuit 3020 may include one or more input processing circuits, units and/or devices 3030 in order that an input signal 3015 from the input signal source 3010 may be rendered more compatible for connection with the CMOS transistor 3050. Such a made-compatible signal 3040 may be output from the input processing unit 3030 and input to CMOS transistor 3050. Among the input processing circuits, units and/or devices 3030 that are contemplated, are, for example, a logic inverter, which may be employed to modify the input signal 3015 to be compatible based on a type (PMOS or NMOS) of the CMOS transistor 3050.

Figure 1:
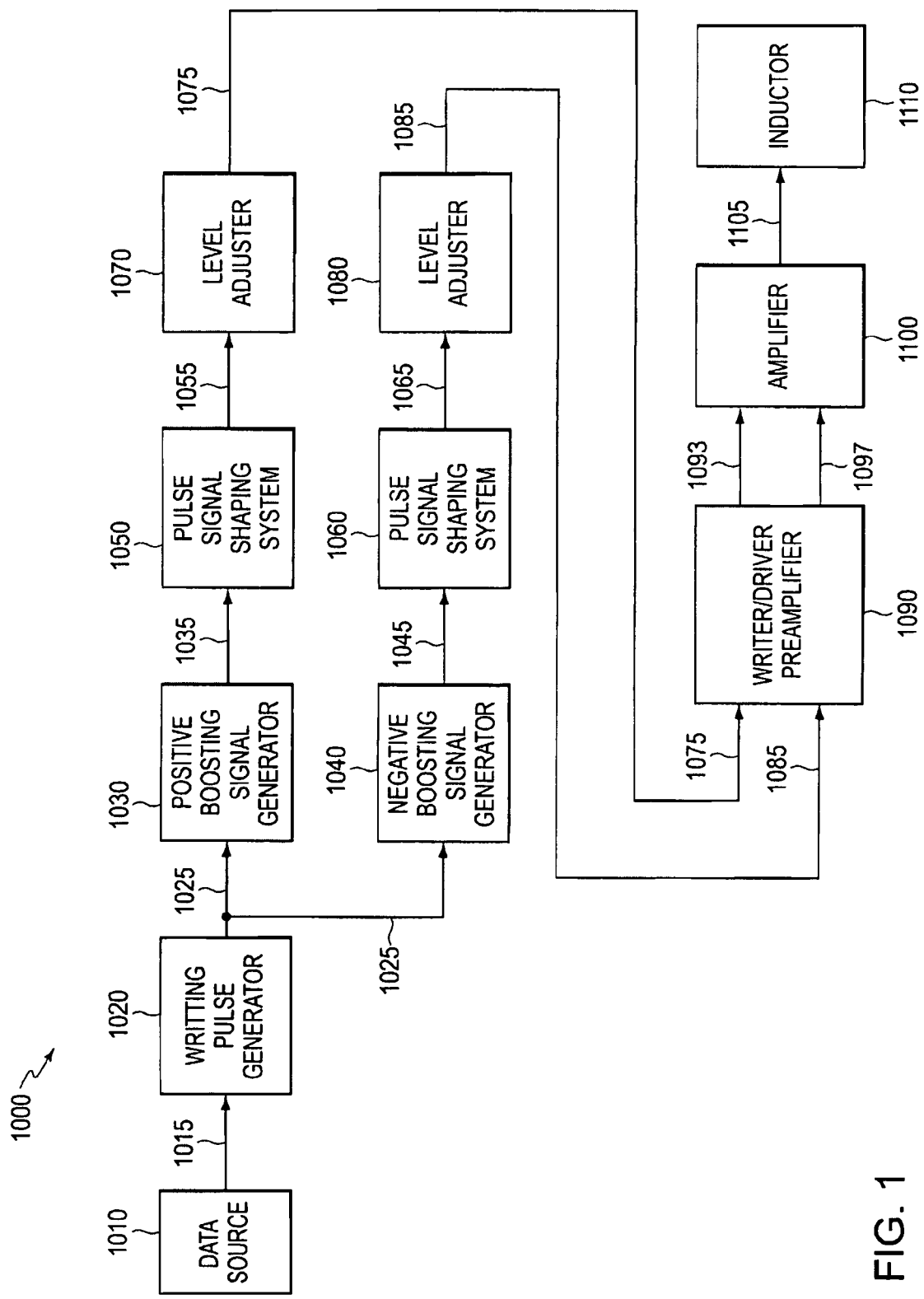
FIG. 1 schematically illustrates a high level simplified block diagram of an exemplary system for a hard disk writing system.
Figure 2:
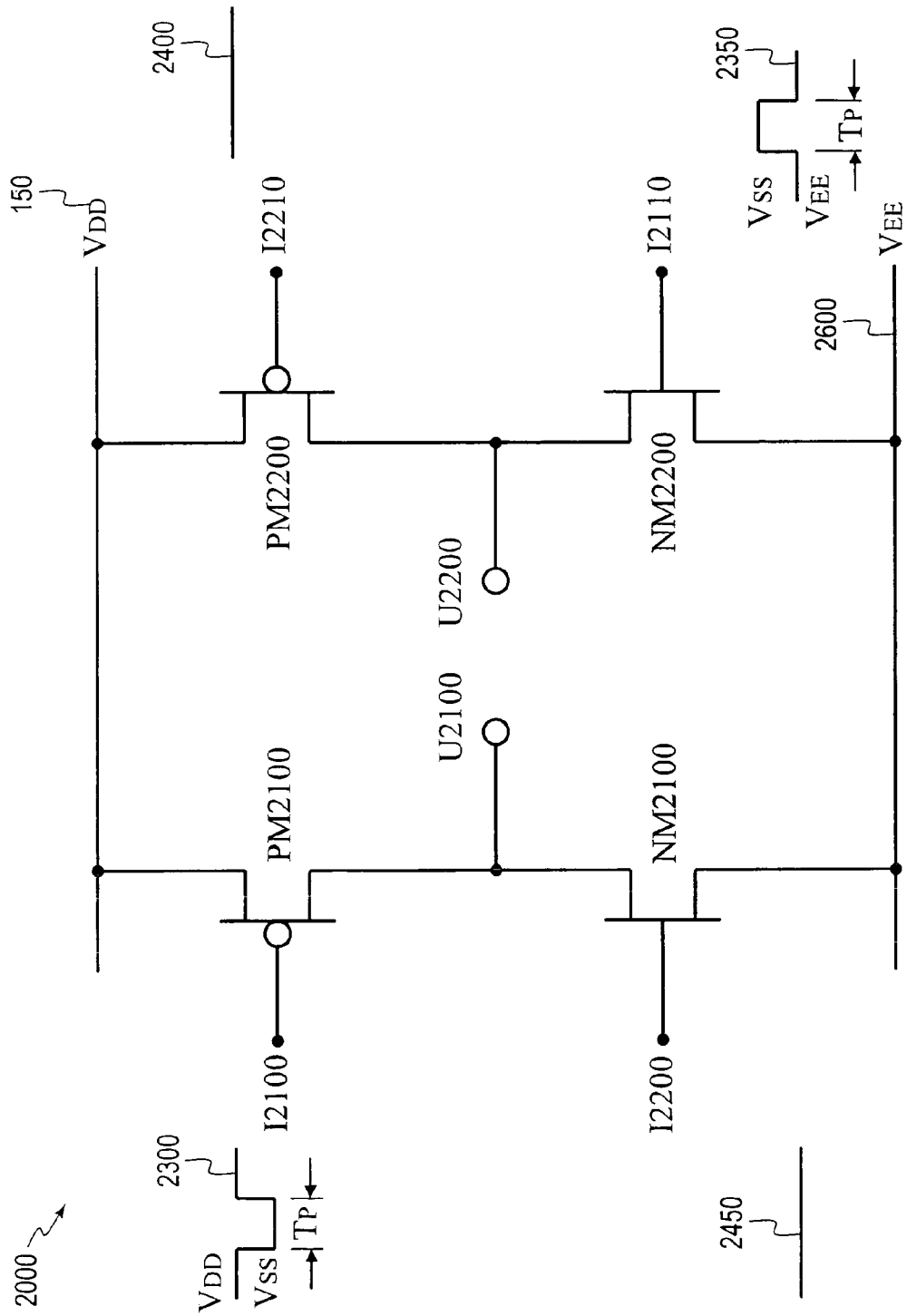
FIG. 2 illustrates a simple schematic of a conventional CMOS based hard disk writer/driver pre-amplifier electronic circuit.

In this regard, the first intermediate circuit does not differ in many respects from the circuit portion for processing an input signal depicted in FIG. 2.

A second intermediate circuit 3070 may include at least one bipolar transistor 3100 and a biasing circuit 3080. An objective of the second intermediate circuit 3070, and specifically of the biasing circuit 3080, as will be described in greater detail below, is to generally modify the input signal 3015 received from the input signal source 3010 in a manner such that an output signal 3090 of the biasing circuit is appropriately conditioned to be properly employed by the bipolar transistor 3100 in a manner by which a compatible second intermediate output signal 3110 may be formed, with respect to at least one discriminating characteristic of the input signal, to be made more compatible with intermediate output signal 3060 from the first intermediate circuit. As indicated above, an objective of this making the second intermediate output signal 3110 compatible with the first intermediate output signal 3060 is to ensure that, as intermediate output signals 3060 and 3110 are presented to some manner of combining circuit 3120, these signals may be presented for combination in order to produce an output signal 3130 in which unwanted, undesired, or unacceptable components in the produced output signal 3130 are reduced and/or substantially eliminated.

Details of an exemplary embodiment of biasing circuit 3080 will be described below with reference FIG. 4.

It should be appreciated that the exemplary embodiments according to this disclosure should not be considered to be limited to any specific circuit design and/or implementation.

Figure 4:
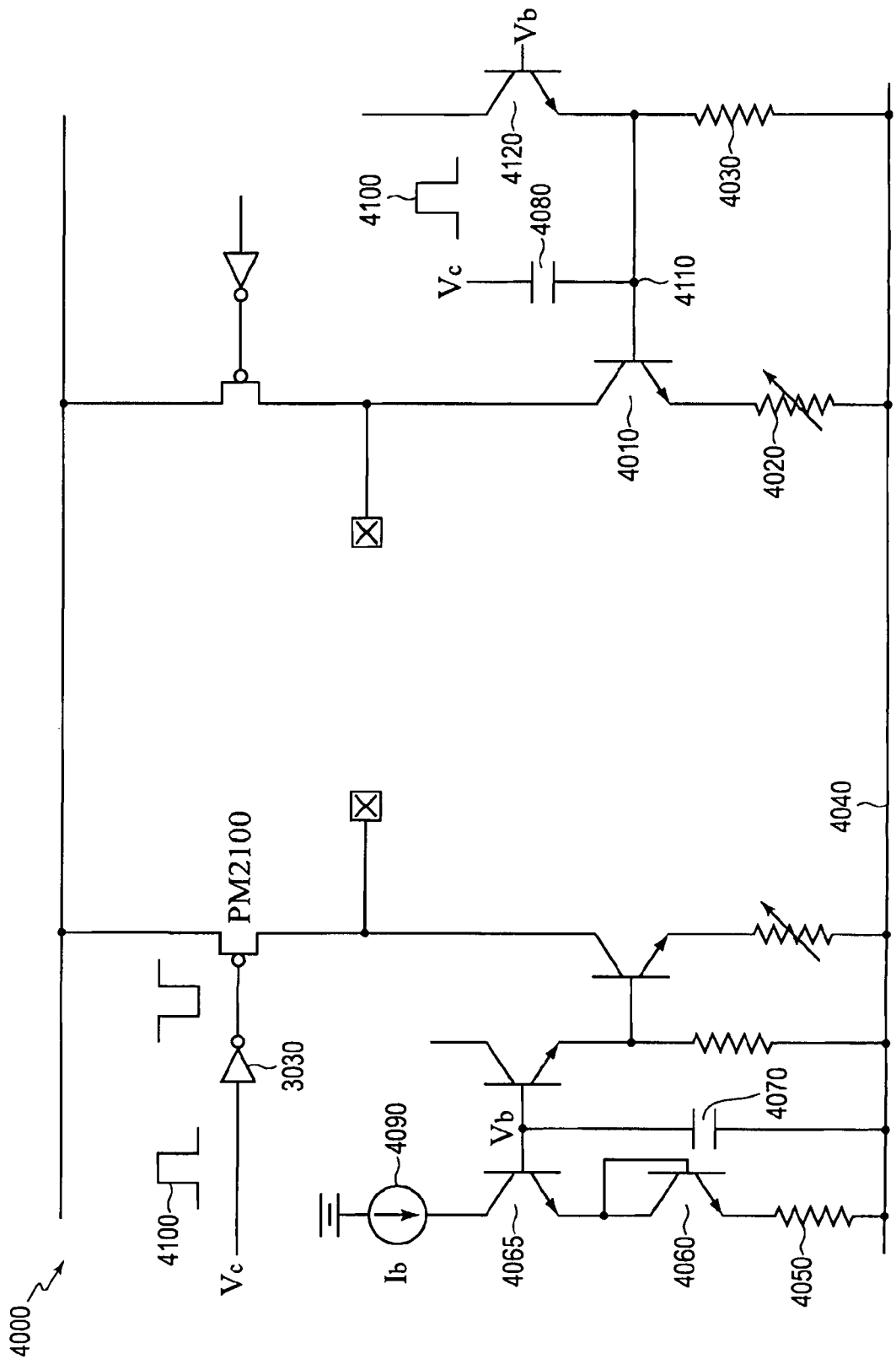
FIG. 4 illustrates a circuit diagram of an exemplary embodiment of a biasing circuit for use in a synchronized current boosting circuit according to this disclosure.

FIG. 4 illustrates a circuit design of an exemplary embodiment of a biasing circuit 4000 that may be included, for example, in the block labeled biasing circuit 3080 in the second intermediate circuit 3070 depicted in FIG. 3. The exemplary biasing circuit 4000 may be employed to bias the bipolar transistor 4010, which corresponds to the bipolar transistor 3100 depicted in FIG. 3. The biasing circuit 4000 may include at least one tunable resistor 4020, at least one non-tunable, or constant, resistor 4030, 4050, at least one voltage supply line 4040, one or more biasing transistors 4060, 4065, 4120, one or more capacitors 4070, 4080, at least one current source 4090, which itself may be tunable or fixed, and a node to receive the input signal 4100.

The biasing circuit 4000 depicted in FIG. 4 is intended to represent a simplified version of one embodiment of a biasing circuit configuration. More sophisticated arrangements of the depicted components, or use of components not depicted in FIG. 4, may be employed within the spirit, scope and intent of this disclosure without improperly modifying the essential structure, or intended function, of the depicted circuit 4000.

As was discussed above, an objective of the biasing circuit 4000 may be to provide a suitable DC bias to the bipolar transistor that forms a part of the second intermediate circuit, depicted in FIG. 3, to maintain that DC bias at an acceptably noise free condition, and/or to remove or substantially reduce a DC bias from the boosting input control signal provided through the node 4100 to the biasing circuit 4000.

The biasing transistors 4060, 4065 may operate in a diode mode in which the series resistor 4050 may operate along with a current source 4090. The combination of the circuit composed of current source 4090, biasing transistors 4060, 4065 and the series resistor 4050 may operate along with the biasing transistor 4120 and the resistor 4030 to set the base of the bipolar transistor 4010 at a predetermined DC value.

The emitter resistor 4020 may be tunable or may be composed of a fixed component in series with a variable component to fine tune the biasing circuit in order to set the strength of the current boosting of transistor 4010. The current source 4090 is depicted symbolically, but may be composed of, for example, a PMOS transistor whose current may be varied to provide a different biasing point for the voltage input Vb.

Capacitor 4070 may be used to filter out, and/or substantially reduce, the DC bias noise at the base 4110 of the bipolar transistor 4010. The capacitor 4080 may serve a function of reducing any change in Vb, the boosting input control signal 4100 may have in order that the signal that is fed to the base 4110 of the bipolar transistor 4010 has a DC bias substantially determined by the biasing circuit 4000.

Figure 5:
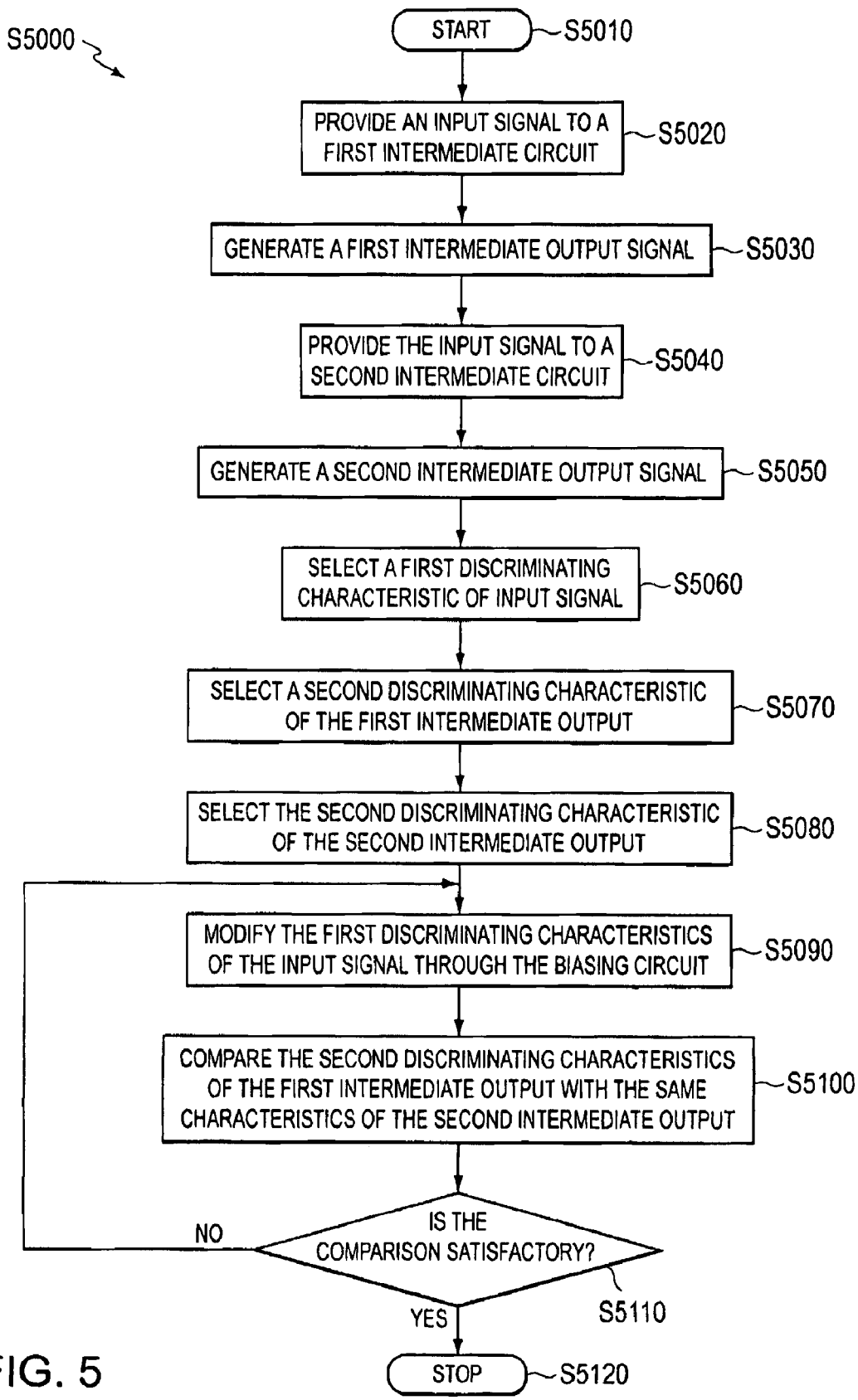
FIG. 5 is a flow diagram of an exemplary method for synchronized current boosting according to this disclosure.

FIG. 5 illustrates an exemplary method 5000 for synchronized current boosting according to this disclosure. As shown in FIG. 5, operation of the method commences at step S5010 and proceeds to S5020.

In step S5020, an input signal is provided to a first intermediate circuit. The first intermediate circuit may include at least one CMOS transistor and other such components and/or devices as may be preferable to process the input signal prior to that signal being introduced to the CMOS transistor. Operation of the method continues to step S5030.

In step S5030, a first intermediate output signal is generated from the first intermediate circuit. The first intermediate output signal is based on the input signal, as processed through the first intermediate circuit. The first intermediate output signal may include a plurality of discriminating characteristics associated with the signal. These discriminating characteristics may include, but are not limited to, pulse transition time instances, pulse transition high levels, pulse transition low levels, pulse rise times, pulse fall times, pulse durations and/or pulse duty cycles, or other like characteristics that may be associated with the first intermediate output signal. Operation of the method continues to step S5040.

In step S5040, the input signal is provided to a second intermediate circuit. In this regard, it is contemplated that the input signal in this step is the same as the input signal in step S5020, i.e., may be generated from the same source. The second intermediate circuit may include some manner of biasing circuit in order to properly condition the input signal for input to a bipolar transistor. Such biasing circuit may include one or more of the following components: a resistive network, which may include at least one tunable resistive element; a DC biasing bipolar transistor network; a network of DC current source, which may include at least one tunable current source element; and/or a capacitive network including one or more capacitive elements. Operation of the method continues to step S5050.

In step S5050, the second intermediate output signal is generated from the second intermediate circuit, in parallel with the first intermediate output signal generated from the first intermediate circuit. As indicated above, the second intermediate output signal is optimally based on the same input signal provided to the first intermediate circuit and is output from the second intermediate circuit having passed through at least the biasing circuit and the bipolar transistor to be essentially synchronous with the first intermediate output signal. Operation of the method continues to step S5060.

It should be appreciated that an objective of conditioning one or the other of the first and second intermediate output signals from respectively the first and second intermediate circuits is undertaken such that when the first and second intermediate output signals are combined to produce an output signal, the first and second intermediate output signals have been made compatible in a manner that may serve to reduce or otherwise eliminate unacceptable components in one or more of the discriminating characteristics of the output signal.

In step S5060, a first discriminating characteristic of the input signal is selected. Operation of the method continues to step S5070.

In step S5070, a second discriminating characteristic is selected from among the plurality of discriminating characteristics with respect to the first intermediate output signal. Operation of the method continues to step S5080.

In step S5080, the same second discriminating characteristic that was selected as associated with the first intermediate output signal is also selected with regard to the second intermediate output signal. Operation of the method continues to step S5090.

In step S5090, the first discriminating characteristic of the input signal is modified via the biasing circuit, an objective of the modification being to render compatible the second discriminating characteristic of the second intermediate output signal with respect to the same discriminating characteristic of the first intermediate output signal. This modification may include, but not be limited to, passing the input signal through the biasing circuit and acting on the input signal through the biasing circuit. Such modification may include varying a value of one or more tunable resistive elements included in a resistive network, or may alternatively include varying a value of one or more tunable current source elements included in a network of DC current sources. Otherwise, such modification may include any process action on at least one discriminating component of the input signal in order to render both intermediate output signals, more compatible to one another and capable of being combined in a manner that does not produce unwanted components in a combined output signal. Operation of the method continues to step S5100.

In step S5100, the second discriminating characteristics of the first intermediate output signal and the second intermediate output signal are compared. Operation of the method continues to step S5110.

Step S5110 is a determination step for determining whether the comparison of step S5100 is satisfactory. Satisfactory criteria may include, for example, whether differences between the two intermediate output signals, specifically with respect to the selected second discriminating characteristic are within acceptable limits, below an acceptable threshold, or otherwise meet some pre-specified comparison criteria.

If, in step S5110, the results of the comparison are deemed to be unsatisfactory, operation of the method reverts to step S5090 where further modification of the first discriminating characteristic of the input signal via, for example, the biasing circuit of the second intermediate circuit is undertaken.

If, in step S5110, the comparison is deemed to be satisfactory according to any one of the above-discussed metrics, operation of the method proceeds to step S5120 where operation of the method ceases.

While the above description has referred to specific embodiments, it should be evident from the above description that many alternatives, modifications, and variations will be apparent to those skilled in the art. Accordingly, the exemplary embodiments according to this disclosure outlined above are intended to be illustrative, and not, in any way, limiting.

What is claimed is:

1. A system for producing an output signal, based on an input signal, comprising:
   a first intermediate circuit including at least one CMOS transistor that produces a first intermediate output signal;
   a second intermediate circuit including at least a biasing circuit and at least one bipolar transistor that produces a second intermediate output signal, the second intermediate circuit being in parallel with the first intermediate circuit; and
   a combining circuit that combines the first intermediate output signal and the second intermediate output signal in differential mode to produce the output signal,
   wherein the input signal is provided to the first intermediate circuit and the input signal is provided to the second intermediate circuit.

2. The system of claim 1, wherein the input signal, the first intermediate output signal and the second intermediate output signal each include a plurality of like discriminating characteristics associated with the signals.

3. The system of claim 2, wherein the plurality of like discriminating characteristics include at least one of pulse transition time instants, a pulse transition high level, a pulse transition low level, a pulse rise time, pulse fall time, a pulse duration, or a pulse duty cycle.

4. The system of claim 2, wherein the biasing circuit modifies at least a first of the plurality of like discriminating characteristics of the input signal such that a second of the plurality of the like discriminating characteristics of the first intermediate output signal and the second of the plurality of the like discriminating characteristics of the second intermediate output signal are matched according to a pre-specified criterion.

5. The system of claim 4, wherein the pre-specified criterion is selected such that unacceptable components in the produced output signal are substantially reduced; and
   wherein the pre-specified criterion for matching is a magnitude of a difference between the second of the plurality of the like discriminating characteristics of the first intermediate output signal and the second of the plurality of the like discriminating characteristics of the second intermediate output signal.

6. The system of claim 5, wherein the pre-specified criterion for matching is a statistical quantity which is at least one of a mean or a standard deviation of a difference between the second of the plurality of the like discriminating characteristics of the first intermediate output signal and the second of the plurality of the like discriminating characteristics of the second intermediate output signal.

7. The system of claim 4, the first intermediate circuit further comprising an inverter, wherein the inverter is provided to modify the input signal depending on whether the CMOS transistor is a PMOS type or an NMOS type before the input signal is applied to the CMOS transistor.

8. The system of claim 4, wherein the second of the plurality of like discriminating characteristics for the matching purpose is selected based on substantially reducing unacceptable components in the output signal; and
   wherein the second of the plurality of like discriminating characteristics is a pulse transition time.

9. The system of claim 4, wherein the second of the plurality of like discriminating characteristics for the matching purpose is selected based on substantially reducing unacceptable components in the output signal; and
   wherein the second of the plurality of like discriminating characteristics is a pulse transition high level.

10. The system of claim 4, wherein the second of the plurality of like discriminating characteristics for the matching purpose is selected based on substantially reducing unacceptable components in the output signal; and
    wherein the second of the plurality of like discriminating characteristics is a pulse transition low level.

11. The system of claim 1, wherein the biasing circuit comprises a resistive network.

12. The system of claim 11, wherein the resistive network includes at least one tunable resistive element.

13. The system of claim 11, wherein a DC bias is set via the resistive network.

14. The system of claim 1, wherein the biasing circuit comprises a DC biasing bipolar transistor network.

15. The system of claim 14, wherein the DC bias is set via a resistive network and the DC biasing bipolar transistor network.

16. The system of claim 1, wherein the biasing circuit comprises a network of DC current sources.

17. The system of claim 16, wherein the network of DC current sources includes at least one tunable current source element.

18. The system of claim 16, wherein a DC bias is set via a resistive network and the network of DC current sources.

19. The system of claim 16, wherein a DC bias is set via a resistive network, a DC biasing bipolar transistor network and a network of DC current sources.

20. The system of claim 1, wherein the biasing circuit comprises a capacitive network.

21. The system of claim 20, wherein a DC bias noise in a resistive network, is reduced via the capacitive network.

22. The system of claim 20, wherein a DC bias noise, in a combination of a resistive network and a DC biasing bipolar transistor network, is reduced via the capacitive network.

23. The system of claim 20, wherein a DC bias noise, in a combination of a resistive network and a network of DC current sources, is reduced via the capacitive network.

24. The system of claim 20, wherein a DC bias noise, in a combination of a resistive network, a network of DC current sources and a DC biasing bipolar transistor network, is reduced via the capacitive network.

25. The system of claim 1, wherein the output signal is a difference between the first intermediate signal and the second intermediate signal.

26. A method for producing an output signal, based on an input signal, comprising:
    providing an input signal to a first intermediate circuit that produces a first intermediate output signal, the first intermediate circuit includes at least one CMOS transistor;
    providing the input signal to a second intermediate circuit that produces a second intermediate output signal, the second intermediate circuit, which is in parallel with the first intermediate circuit, includes at least a biasing circuit and at least one bipolar transistor;

combining the first intermediate output signal and the second intermediate output signal in differential mode to produce the output signal, the first intermediate output signal and the second intermediate output signal are combined in a manner that substantially reduces unacceptable components in the output signal.

27. The method of claim 26, wherein the input signal, the first intermediate output signal and the second intermediate output signal each have a plurality of like discriminating characteristics associated with the signals.

28. The method of claim 27, wherein the plurality of like discriminating characteristics include at least one of pulse transition time instants, a pulse transition high level, a pulse transition low level, a pulse rise time, pulse fall time, a pulse duration, and or a pulse duty cycle.

29. The method of claim 27, further comprising modifying at least a first of the plurality of like discriminating characteristics of the input signal such that a second of the plurality of the like discriminating characteristics of the first intermediate output signal and the second of the plurality of the like discriminating characteristics of the second intermediate output signal are matched according to a pre-specified criterion via the biasing circuit.

30. The method of claim 29, further comprising selecting a pre-specified matching criterion such that unacceptable components in the output signal are substantially reduced.

31. The method of claim 30, further comprising:
computing a magnitude of a difference between the second of the plurality of the like discriminating characteristics of the first intermediate output signal and the second of the plurality of the like discriminating characteristics of the second intermediate output signal; and
comparing the computed magnitude of the difference with the selected pre-specified matching criterion,
wherein if the comparing renders an unacceptable result, further modifying of the at least the first of the plurality of like discriminating characteristics of the input signal is undertaken.

32. The method of claim 30, further comprising:
computing a statistical quantity which is a mean and/or a standard deviation of the magnitude of a difference, between the second of the plurality of the like discriminating characteristics of the first intermediate output signal and the second of the plurality of the like discriminating characteristics of the second intermediate output signal, when the discriminating characteristics of the input signal are not fixed but are varying with time; and
comparing the computed statistical quantity with the selected pre-specified matching criterion,
wherein if the comparing renders an unacceptable result, further modifying of the at least the first of the plurality of like discriminating characteristics of the input signal is undertaken.

33. The method of claim 26, further comprising pre-modifying the input signal in the first intermediate circuit via an inverter depending on whether the CMOS transistor is a PMOS type or an NMOS type.

34. The method of claim 26, further comprising selecting the second of the plurality of like discriminating characteristics for the matching purpose based on substantially reducing unacceptable components in the output signal.

35. The method of claim 34, further comprising selecting the second of the plurality of like discriminating characteristics to be a pulse transition time.

36. The method of claim 34, further comprising selecting the second of the plurality of like discriminating characteristics to be a pulse transition high level.

37. The method of claim 34, further comprising selecting the second of the plurality of like discriminating characteristics to be a pulse transition low level.

38. The method of claim 26, further comprising setting a DC bias to the bipolar transistor via the biasing circuit.

39. The method of claim 38, wherein setting the DC bias to the bipolar transistor is accomplished via a resistive network.

40. The method of claim 39, wherein setting the DC bias to the bipolar transistor is accomplished via a tunable resistive element in the resistive network.

41. The method of claim 39, wherein setting the DC bias to the bipolar transistor includes reducing DC bias noise in the resistive network via a capacitive network.

42. The method of claim 38, wherein setting the DC bias to the bipolar transistor is accomplished via a resistive network and a DC biasing bipolar transistor network.

43. The method of claim 42, wherein setting the DC bias to the bipolar transistor includes reducing DC bias noise in a combination of the resistive network and the DC biasing bipolar transistor network via a capacitive network.

44. The method of claim 38, wherein setting the DC bias to the bipolar transistor is accomplished via a resistive network and a network of DC current sources.

45. The method of claim 44, wherein setting the DC bias to the bipolar transistor is accomplished via a tunable current source element in the network of DC current sources.

46. The method of claim 44, wherein setting the DC bias to the bipolar transistor includes reducing DC bias noise in a combination of the resistive network and the network of DC current sources via a capacitive network.

47. The method of claim 38, wherein setting the DC bias to the bipolar transistor is accomplished via a resistive network, a DC biasing bipolar transistor network and a network of DC current sources.

48. The method of claim 47, wherein setting the DC bias to the bipolar transistor is accomplished via at least one of a tunable current source element or a tunable resistive element.

49. The method of claim 47, wherein setting the DC bias to the bipolar transistor includes reducing DC bias noise in a combination of the resistive network, the DC biasing bipolar transistor network and the network of DC current sources via a capacitive network.

* * * * *